(12) United States Patent
Schmidbauer et al.

(10) Patent No.: US 6,221,757 B1
(45) Date of Patent: Apr. 24, 2001

(54) METHOD OF MAKING A MICROELECTRONIC STRUCTURE

(75) Inventors: Sven Schmidbauer; Alexander Ruf, both of Dresden (DE); Florian Schnabel, Wappinger Falls, NY (US); Mark Hoinkis; Stefan Weber, both of East Fishkill, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/234,341

(22) Filed: Jan. 20, 1999

(51) Int. Cl.$^7$ .................................. H01L 21/4763
(52) U.S. Cl. .................. 438/625; 438/627; 438/629; 438/643; 438/648; 438/653; 438/656; 438/685; 438/687
(58) Field of Search .................. 438/622, 625, 438/626, 627, 628, 629, 631, 633, 643, 644, 645, 648, 653, 654, 666, 660, 672, 675, 685, 687

(56) References Cited

U.S. PATENT DOCUMENTS 5,221,449 * 6/1993 Colgan et al. .................. 204/192.15
5,268,806 * 12/1993 Goubau et al. .................. 360/113
5,281,485 * 1/1994 Colgan et al. .................. 428/457
5,744,394 * 4/1998 Iguchi et al. .................. 438/276
5,847,463 * 12/1998 Trivedi et al. .................. 257/751

FOREIGN PATENT DOCUMENTS 0 751 566 A2   1/1997   (EP) .

OTHER PUBLICATIONS

Japanese Patent Abstract JP 01042857 (Toshio), dated Feb. 15, 1989.
Japanese Patent Abstract JP 04035035 (Tsutomu), dated Feb. 5, 1992.

* cited by examiner

Primary Examiner—Jey Tsai
Assistant Examiner—Lynne A. Gurley
(74) Attorney, Agent, or Firm—Herbert L. Lerner; Laurence A. Greenberg; Werner H. Stemer

(57) ABSTRACT

A microelectronic structure is formed on a first layer or a substrate. The first layer or substrate is formed with grooves and contact openings. A metal nitride layer of TiN or WN covers the first layer or the substrate at least partially. An alpha-phase tantalum layer is deposited on top of the metal nitride layer. Finally, a metal is deposited to completely fill the grooves and the contact openings.

5 Claims, 3 Drawing Sheets

METHOD OF MAKING A MICROELECTRONIC STRUCTURE

BACKGROUND OF THE INVENTION

Field of the Invention

The present invention relates to a semiconductor device and in particular to a metal diffusion barrier for electrical interconnections.

A semiconductor device commonly comprises a semiconductor substrate with a plurality of active areas on its surface and multiple metallization layers on top of that surface. The metallization layers are mutually separated by dielectric layers made of $SiO_2$, $Si_3N_4$, BPSG or other suitable materials and comprise a plurality of conductive tracks on top of the dielectric layers or in grooves which are formed on the surface of the dielectric layers. These conductive tracks define, in conjunction with contact openings through the dielectric layers, the interconnection structure of the semiconductor device.

To form such an interconnection structure a dielectric layer is deposited on top of the semiconductor substrate or on top of a metallization layer and subsequently anisotropically etched to form contact openings (vias) which extend through the dielectric layer to the metallization layer or to the substrate. In the next step, the vias are filled with an electrical conductive material such as tungsten or polysilicon. Finally, a metal layer is deposited on top of the dielectric layer and subsequently structured.

In another approach to form an interconnection structure grooves are additionally formed in the dielectric layer after the formation of the contact openings. The grooves which are partially in contact with the contact openings define the location of the conductive tracks. Preferably, the grooves and the contact openings are completely filled with a conductive material in one step. The conductive material is subsequently polished back to the top surface of the dielectric layer in order to obtain a plain surface with completely filled grooves. This method is called a dual damascene process.

The materials mainly used for the metallization are aluminum, tungsten and polysilicon. However, as the structuring size of the semiconductor device is scaled down to submicron dimensions, the electrical resistance of the vias and the conductive tracks increases due to the reduced cross-section of the conductive structures. To overcome this problem, the use of highly conductive materials such as copper (Cu) has been proposed. Unfortunately, copper tends to diffuse into the dielectric layer and the active areas of the semiconductor substrate and therefore has to be completely encapsulated by a metal diffusion barrier. An appropriate material for such a diffusion barrier is for instance tantalum (Ta) (see U.S. Pat. Nos. 5,714,418; 5,528,599, and 5,817,572).

Due to adhesion problems of tantalum to a variety of dielectric materials such as $SiO_2$, an additional tantalum nitride layer (TaN) between the Ta and the dielectric layer has been suggested (see published European patent application EP 0 751 566 A2). Since TaN can only be deposited by a PVD process it is difficult to obtain a thin and highly conformal layer, which is very important for reliable interconnections of submicron size.

SUMMARY OF THE INVENTION

The present invention describes a microelectronic structure comprising:
a first layer;
a metal nitride layer TiN or WN covering at least partially the first layer;
a tantalum layer on top of the metal nitride layer; and
a metal layer on top of the tantalum layer.

By using titanium nitride (TiN) or tungsten nitride (WN) instead of tantalum nitride as the adhesion layer, it is possible to obtain a very thin and uniform layer. Moreover, TiN and WN act additionally as a diffusion barrier against the diffusion of Cu. Preferably, TiN or WN is deposited by a highly conformal CVD-process.

The invention further provides a microelectronic structure comprising:
a first layer, which covers at least partially a second layer having conductive regions;
the first layer having an upper and a lower surface, the upper surface having grooves formed therein, some of the grooves having openings extending to the lower surface to expose the conductive regions of the second layer;
CVD-deposited metal nitride layer comprises a material selected from the group consisting of TiN and WN, which lines completely the grooves and the openings of the first layer;
a tantalum layer on top of the metal nitride layer; and
a metal layer on top of the tantalum layer, whereat the grooves and openings are substantially filled by the metal layer.

The present invention further provides a method of forming a microelectronic structure having a first layer. The method comprises the following steps:
conformally depositing a metal nitride layer on the first layer, the metal nitride layer comprises a material selected from the group consisting of TiN and WN;
depositing a tantalum layer on top of the metal nitride layer; and
depositing a metal layer on top of the tantalum layer.

In accordance with an added feature of the invention, the metal layer is completely separated from the first layer by the metal nitride layer and the tantalum layer.

In accordance with an additional feature of the invention, the metal nitride layer has a thickness ranging from about 5 nm to about 30 nm.

In accordance with another feature of the invention, the tantalum layer has a thickness ranging from about 10 nm to about 50 nm.

In accordance with again another feature of the invention, the metal layer is formed of Cu, Al, or a Cu-alloy.

In accordance with a further feature of the invention, the first layer has an upper surface with grooves formed therein, the grooves being lined by the metal nitride layer and the tantalum layer, and the grooves being substantially filled by the metal layer.

In accordance with a concomitant feature of the invention, a second layer is formed with conductive regions, the first layer at least partially covering the second layer, the first layer having an upper surface and a lower surface and openings formed therein extending from the upper surface to the lower surface to expose the conductive regions of the second layer, the openings being substantially filled by the metal layer.

Although the invention is illustrated and described herein as embodied in microelectronic structure and method, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

The invention will be described with reference to a method of forming a microelectronic structure having copper wiring (conductive tracks).

Figure 1:
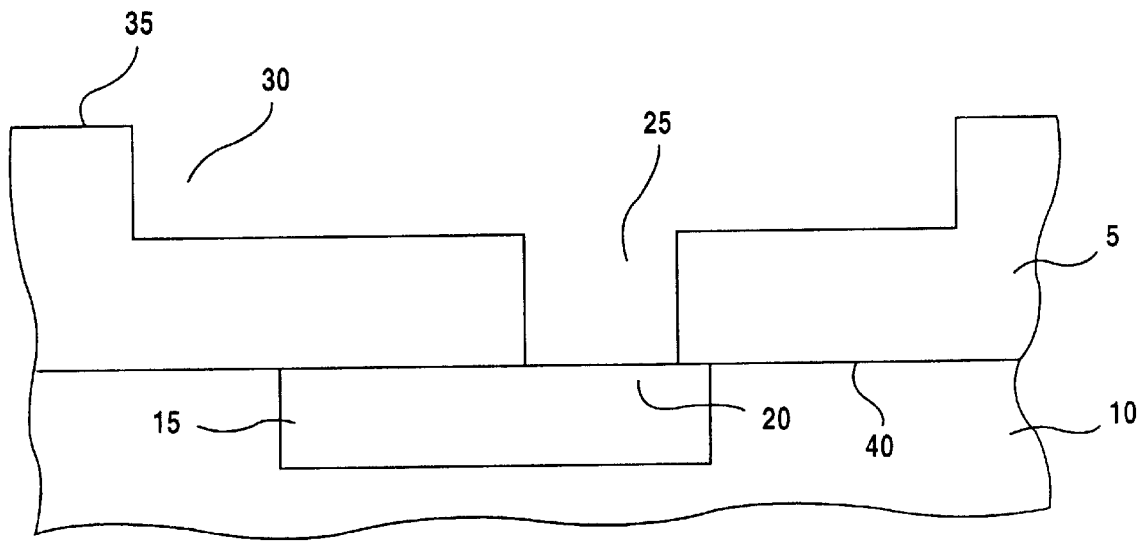
FIG. 1 is a diagrammatic view of a microelectronic structure with a first layer with integrally formed grooves and contact openings.

Referring now to the figures of the drawing in detail and first, particularly, to FIG. 1 thereof, there is seen an exemplary microelectronic structure with a first layer 5 that covers at least partially a second layer 10. The first layer 5, often known as inter-level dielectrics (ILD), is made of $SiO_2$, BPSG (boron phosphate silicate glass), TEOS (Tetraethylorthosilane), $Si_3N_4$ or other suitable dielectric materials having a relative low dielectric constant. It is also preferred to use a combination of the above mentioned materials for the layer 5. Further, in another preferred embodiment, the layer 5 consists of multiple layers which comprise a thin silicon nitride layer underlying a thick silicon oxide layer. If the second layer 10 functioned as an ILD as well, it preferably consists of the same material as the first layer 5. In that case, the second layer 10 has conductive tracks 15 integrally formed on its surface which represent conductive regions 20.

In another preferred embodiment, the second layer 10 represents a semiconductor substrate 10 such as monocrystalline silicon having conductive regions 20 in the form of active areas 20. These areas are usually formed by suitable doping of the semiconductor substrate 10.

After depositing the first layer 5 on top of the second layer 10 of the semiconductor substrate 10, at least one opening 25 is etched into the first layer 5. This is done using an etching mask, for instance a photolithographically structured resist, and an etching medium such as $CF_4$, $CHF_3$ and argon (Ar). Subsequently, grooves 30 are formed in the upper surface 35 of the first layer 5 by another etching step using a second etching mask. During that etching care has to be taken not to completely remove the first layer 5 in the regions which are not masked by the etching mask. This can either be done by using an etch stop layer which is located within the first layer 5 or by premature termination of the etching process. Other possibilities to provide a dielectric layer with grooves and contact openings are described in U.S. Pat. Nos. 5,726,100 and 5,612,254, the disclosures of which are herewith expressly incorporated by reference.

The resulting structure is shown in FIG. 1. The opening or the openings 25 extend from the upper surface 35 to the lower surface 40 of the first layer 5, whereas the grooves 30 are only formed on the upper surface 35.

Figure 2:
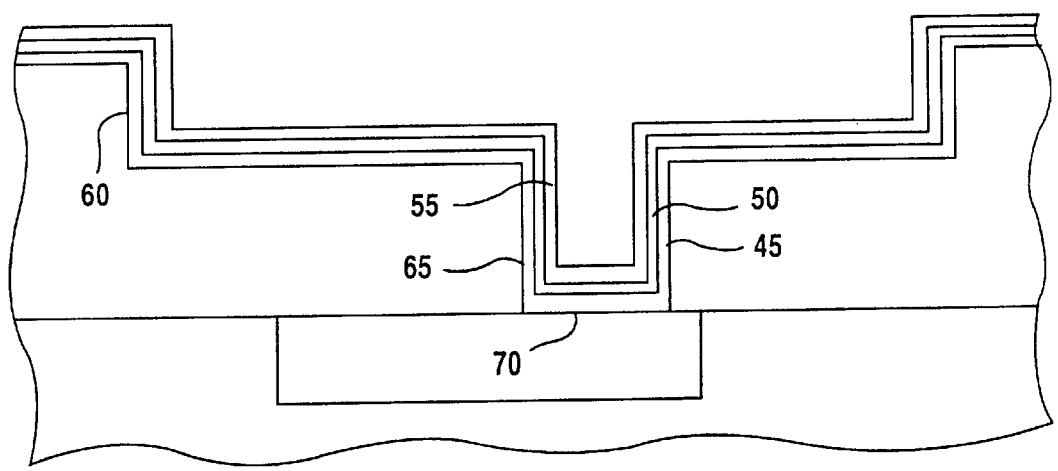
FIG. 2 is a similar view of the microelectronic structure after the deposition of an adhesion layer, a tantalum layer and a catalytic layer.

Reference will now be had to FIG. 2, which shows the microelectronic structure after the deposition of several layers. In a first step the microelectronic structure is introduced into a suitable chamber to perform a degas-step. This pretreatment is performed at about 350° C. and serves as a cleaning step to remove adsorbed contamination. As a further cleaning step an argon sputter process is preferably applied in a separate chamber to remove, for instance, native oxides. Next, the precleaned microelectronic structure is transferred into a CVD-chamber to deposit a metal nitride layer 45, such as a CVD-TiN layer. The TiN-layer is deposited by chemical vapor deposition using TDEAT (Tetrakis-diethylaminotitanium) precursors at a temperature in the range of about 240° C.–400° C., preferably at about 360° C. The resulting TiN-layer has a thickness of about 5–30 nm, preferably 10 nm.

Subsequently, the microelectronic structure with the deposited TiN-layer 45 is transferred to a chamber, capable of performing an ionized physical vapor deposition (I-PVD). This chamber is kept at a temperature of about 250° C. The following sputter deposition of a tantalum layer 50 on top of the TiN-layer 45 is preferably performed at a temperature between 200° C. and 300° C., preferably at about 250° C. After the deposition the Ta-layer 50 is about 10–50 nm, preferably 40 nm thick.

In a further deposition step, a so called catalytic layer 55 (about 150 nm thick) is deposited on top of the Ta-layer 50 in an additional I-PVD chamber at about 25° C. The catalytic layer 55 substantially consists of copper. Since that layer is deposited at low temperature it has a very fine crystalline structure which is essential for further deposition of copper.

It is preferred to perform all the deposition steps in a system comprising at least a CVD-chamber and two I-PVD chambers connected by a suitable device to carry the processed microelectronic structure from one chamber to the other without interrupting the vacuum. If such a system is not available, one has to perform additional degas and preclean steps before the deposition of the tantalum layer and the catalytic layer.

By using a TiN-layer 50 deposited by a CVD-process a highly conformal adhesion layer is provided which shows a uniform covering of the upper surface 35 of the first layer 5, the bottom 70 of the openings 25 and the sidewalls 60 and 65 of the grooves 30 and openings 25, respectively. Another advantage of such a deposited TiN-layer is the low contact resistance between the TiN and the Ta, since CVD-TiN enables the formation of the preferred alpha-phase of tantalum, which has been identified as an important prerequisite for the copper deposition (see European EP 0 751 566 A2).

The double layer system formed by using the present invention comprises the CVD-TiN and the Ta layer which both materials act as metal diffusion barrier. Moreover, CVD-TiN has a very fine crystalline, partially amorph structure which allows a very conformal covering of fine structures (for instance openings down to 0.2 micron and less) and which supports the formation of the alpha-phase of tantalum.

If tungsten nitride (WN) is used instead of TiN, similar results are obtained.

Figure 3:
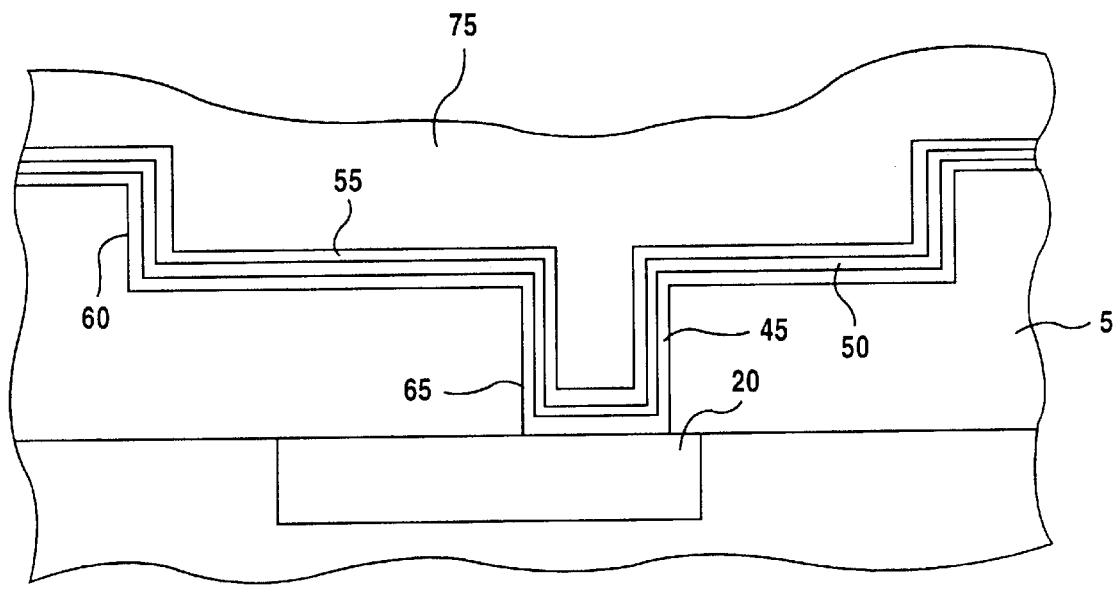
FIG. 3 is a similar view of the microelectronic structure after the deposition of a metal layer.
Figure 4:
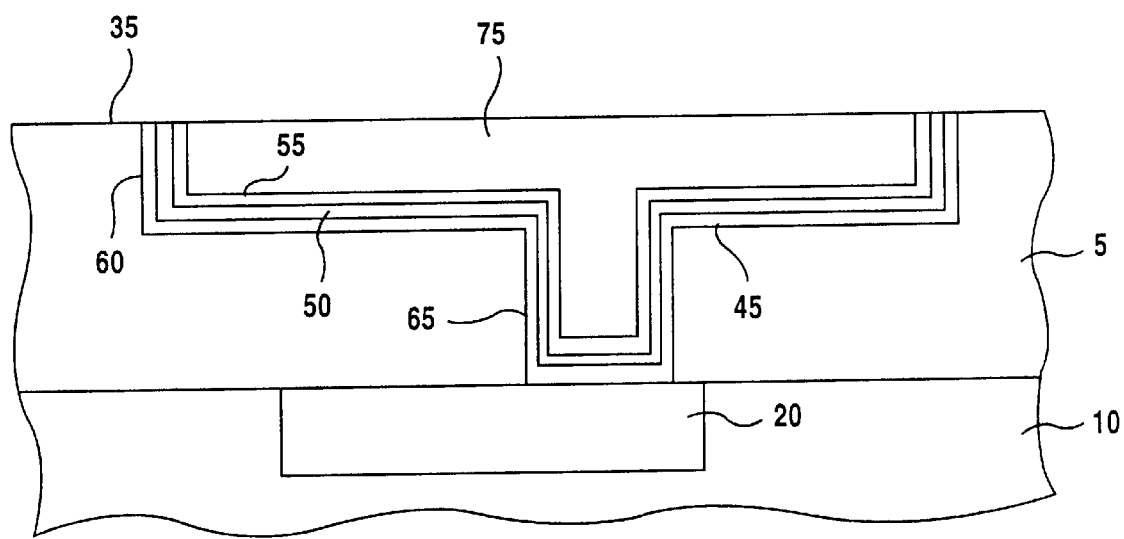
FIG. 4 is a similar view of the microelectronic structure after a polishing step.

Reference will now be had to FIG. 3, which shows the microelectronic structure after the deposition of copper as a metal layer 75 by electroplating. Instead of copper it is also possible to deposit aluminum or a copper-alloy. During that deposition the openings 25 and the grooves 30 are substantially filled with copper. Finally, the metal layer 75 including the TiN-layer 45 and the tantalum layer 50 are etched back preferably by chemical mechanical polishing. The resulting structure is shown in FIG. 4. The back-etched copper 75, buried in the grooves 30 and the contact openings 25, forms conductive tracks having a low resistance and a good electrical contact to the conductive regions 20 of the second layer 10.

It is important to note that the copper 75 should be completely separated from the first layer 5 by the TiN-layer 45 and Ta-layer 50 to prevent any contact between copper and the dielectric.

Figure 5:
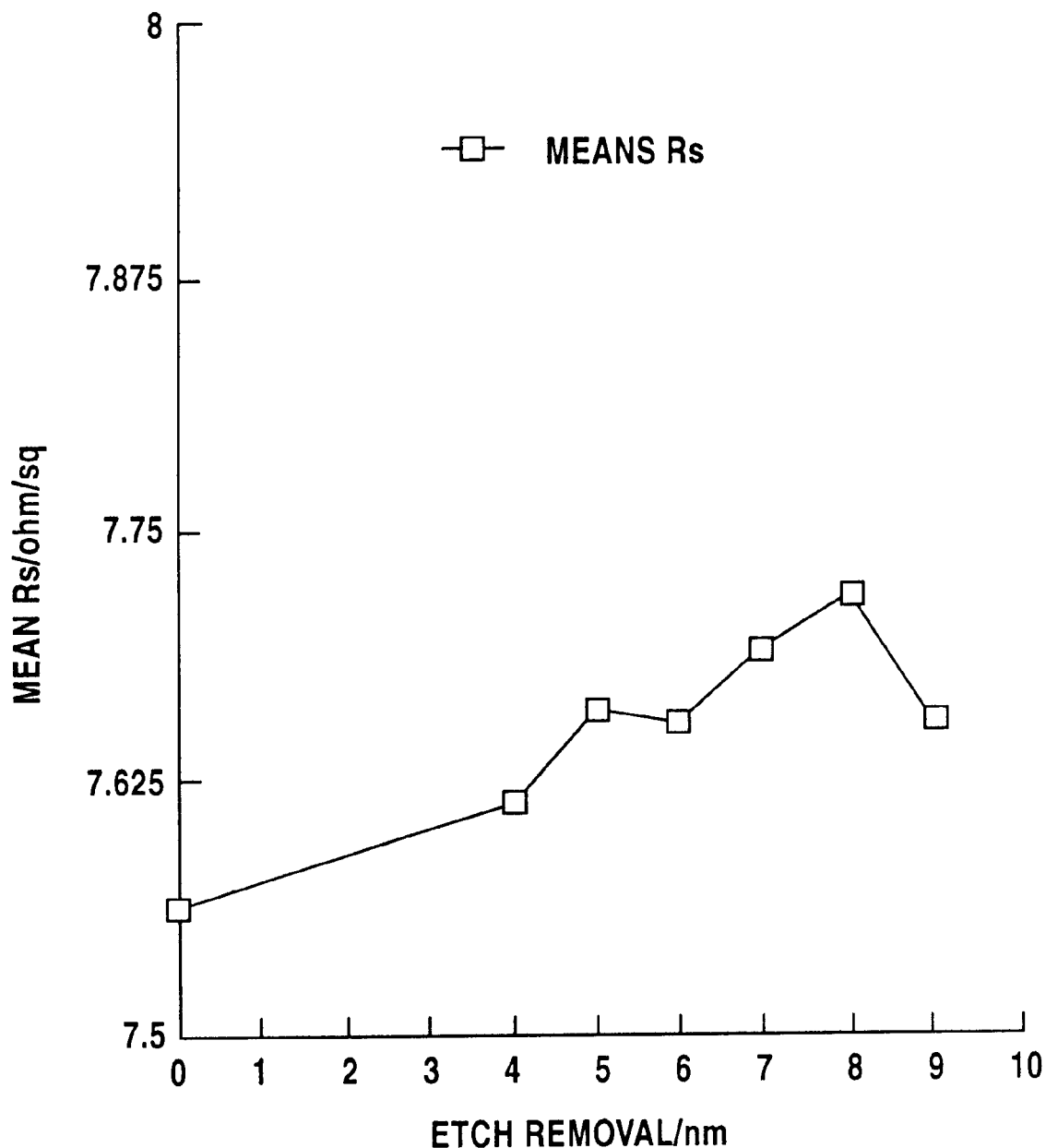
FIG. 5 is a graph showing the resistivity of a tantalum layer deposited using the present invention.

Measurements of the electrical resistance have shown that the tantalum layer 50 growing on the TiN-layer 45 deposited by chemical vapor deposition exhibits the alpha phase. This result can be verified by measuring the resistivity of the tantalum layer 50. As shown in FIG. 5 the resistivity measured as described in Sze, "Physics of Semiconductor Devices" 1981, John Wiley & Sons, 2nd ed., pp.31–32 does not exceed 8 $\Omega$/sq which is characteristic for the tantalum alpha-phase. FIG. 5 further reveals that back-etching of CVD-TiN prior to the tantalum deposition does not lead significantly to a change of the tantalum layer resistivity. The described measurements were carried out using a 10 nm thick CVD-TiN layer deposited at about 340° C. and 60 torr underlying a 40 nm thick tantalum layer. The step coverage of both layers is very high.

We claim:

1. A method of forming a microelectronic structure, which comprises:
    providing a first layer;
    conformally depositing a metal nitride layer of a material selected from the group consisting of TiN and WN on the first layer by chemical vapor deposition;
    depositing a tantalum layer on the metal nitride layer, the tantalum layer consisting essentially of alpha-phase tantalum; and
    depositing a metal layer on the tantalum layer.

2. The method according to claim 1, which comprises depositing the metal nitride layer at a thickness of substantially 5 nm to substantially 30 nm.

3. The method according to claim 1, which comprises depositing the metal nitride layer at a temperature of substantially 240–400° C.

4. The method according to claim 1, which comprises depositing the tantalum layer at a temperature of substantially 200–300° C.

5. The method according to claim 1, which comprises depositing the tantalum layer at a thickness of substantially 10 nm to substantially 50 nm.

\* \* \* \* \*